United States Patent
Ikenouchi

(10) Patent No.: US 10,892,253 B2
(45) Date of Patent: Jan. 12, 2021

(54) SEMICONDUCTOR DEVICE MANUFACTURING METHOD AND SEMICONDUCTOR DEVICE

(71) Applicant: FUJI ELECTRIC CO.,LTD., Kanagawa (JP)

(72) Inventor: Shun Ikenouchi, Saitama (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/114,225

(22) Filed: Aug. 28, 2018

(65) Prior Publication Data

US 2018/0366449 A1 Dec. 20, 2018

Related U.S. Application Data

(63) Continuation of application No. PCT/JP2017/028498, filed on Aug. 4, 2017.

(30) Foreign Application Priority Data

Sep. 9, 2016 (JP) ................. 2016-176834

(51) Int. Cl.
*H01L 25/07* (2006.01)
*H01L 23/31* (2006.01)
(Continued)

(52) U.S. Cl.
CPC .......... *H01L 25/07* (2013.01); *H01L 23/3121* (2013.01); *H01L 23/3135* (2013.01);
(Continued)

(58) Field of Classification Search
CPC ................ H01L 25/07; H01L 23/3157; H01L 23/3135; H01L 23/3121; H01L 24/03;
(Continued)

(56) References Cited

U.S. PATENT DOCUMENTS 6,132,588 A * 10/2000 Yoshizawa ............. H05K 3/242
205/125
6,252,010 B1 * 6/2001 Takeuchi ................ B32B 15/08
525/403
(Continued)

FOREIGN PATENT DOCUMENTS

| JP | H08148531 A | 6/1996 |
|---|---|---|
| JP | H10270609 A | 10/1998 |

(Continued)

OTHER PUBLICATIONS

International Search Report for International Patent Application No. PCT/JP2017/028498, issued by the Japan Patent Office dated Oct. 31, 2017.

*Primary Examiner* — Syed I Gheyas

(57) ABSTRACT

To provide a semiconductor device 100 including a semiconductor element with a less warped chip. A semiconductor device manufacturing method include: bonding a rear surface of a chip having electrodes on both sides thereof to a front surface of a substrate; providing, to the front surface of the substrate to which the chip is bonded, a plating protective film having an opening at a position which is on the front surface of the chip and corresponds to an electrode at which plating is to be formed, after the bonding; plating the electrode of the chip after the providing; and removing the plating protective film from the substrate, after the plating.

10 Claims, 15 Drawing Sheets

(51) Int. Cl.
*H01L 23/00* (2006.01)
*H01L 25/18* (2006.01)

(52) U.S. Cl.
CPC .......... *H01L 23/3157* (2013.01); *H01L 24/03* (2013.01); *H01L 25/072* (2013.01); *H01L 25/18* (2013.01); *H01L 2221/68386* (2013.01); *H01L 2224/01* (2013.01); *H01L 2224/03464* (2013.01); *H01L 2224/18* (2013.01); *H01L 2224/33* (2013.01); *H01L 2924/1306* (2013.01); *H01L 2924/13055* (2013.01); *H01L 2924/13091* (2013.01); *H01L 2924/181* (2013.01)

(58) Field of Classification Search
CPC ......... H01L 2924/13091; H01L 25/072; H01L 2924/13055; H01L 2221/68386; H01L 2224/01; H01L 2924/181; H01L 2924/1306; H01L 2224/03464; H01L 2224/18; H01L 2224/33; H01L 25/18
See application file for complete search history.

(56) References Cited

U.S. PATENT DOCUMENTS

| | | | |
|---|---|---|---|
| 2001/0040290 A1* | 11/2001 | Sakurai | H01L 23/3128 257/737 |
| 2005/0170555 A1* | 8/2005 | Hirano | H01L 21/76838 438/106 |
| 2011/0256668 A1 | 10/2011 | Urano | |
| 2014/0120716 A1 | 5/2014 | Sakaguchi et al. | |
| 2014/0264679 A1* | 9/2014 | Lee | H01L 43/12 257/427 |
| 2015/0001726 A1* | 1/2015 | Lee | H01L 27/04 257/762 |
| 2017/0076948 A1* | 3/2017 | Nakata | H01L 21/288 |

FOREIGN PATENT DOCUMENTS

| | | |
|---|---|---|
| JP | 2000156459 A | 6/2000 |
| JP | 2005019830 A | 1/2005 |
| JP | 2011077460 A | 4/2011 |
| JP | 2011222898 A | 11/2011 |
| JP | 2014086667 A | 5/2014 |

* cited by examiner

SEMICONDUCTOR DEVICE MANUFACTURING METHOD AND SEMICONDUCTOR DEVICE

The contents of the following Japanese patent application are incorporated herein by reference:
NO. 2016-176834 filed in JP on Sep. 9, 2016
NO. PCT/JP2017/028498 filed on Aug. 4, 2017.

BACKGROUND

1. Technical Field

The present invention relates to a semiconductor device manufacturing method and a semiconductor device.

2. Related Art

In fields that require efficient power conversion such as the renewable energy field related to solar power generation, wind power generation and the like, the in-vehicle field related to hybrid automobiles, electric automobiles and the like, and the railway field related to cars, power semiconductor devices (also simply called semiconductor devices) are widely used. In a semiconductor device, for example, a switching element such as a metal-oxide semiconductor field-effect transistor (MOSFET) or an insulated gate bipolar transistor (IGBT) and a diode element connected in anti-parallel with the switching element, such as a free wheel diode (FWD) or a Schottky barrier diode (SBD), are used. These switching elements and diode elements are collectively called semiconductor elements.

In order to reduce wiring capacity, reduce the capacity of a package or improve the capability to expel heat for the purposes of achieving high-density implementation of a semiconductor device, improving current density, accelerating the speed of switching, and so on, it is considered desirable to bond an external terminal to a front surface electrode of a semiconductor element by solder-bonding. In view of this, for example, a metal layer with good solder-wettability such as nickel is provided to a surface of a semiconductor element by electroless plating, in some cases (please see Patent Literature 1, for example). Here, electrical properties of the semiconductor element such as the short-circuit withstand capability or power cycle withstand capability are further improved by making the metal layer thick. However, for example if the thickness of the metal layer (that is, the film thickness of a plating film) is made 2 μm or longer for a wafer thickness of 200 μm or smaller, tensile stress is concentrated at a surface, and concave warping occurs to the surface side of the wafer in some cases. In view of this, Patent Literature 2 discloses a technique for a semiconductor device having a front surface electrode and a rear surface electrode in which one of a plating film of the front surface electrode and a plating film of the rear surface electrode is made thicker than the other to suppress warping of a wafer.

Patent Literature 1: Japanese Patent Application Publication No. 2005-19830
Patent Literature 2: Japanese Patent Application Publication No. 2011-77460

However, formation of a metal layer by electroless plating is normally performed on a wafer-by-wafer basis, so warping of wafers increase, and the wafers are damaged thereby, in some cases. In addition, warping occurs to chips obtained by dividing a wafer into pieces, that is, semiconductor elements, and if the semiconductor elements are solder-bonded onto a substrate, solder voids may occur in some cases.

SUMMARY (Item 1)
A semiconductor device manufacturing method may include bonding a rear surface of a chip having electrodes on both sides thereof to a front surface of a substrate.

The semiconductor device manufacturing method may include providing, to the front surface of the substrate to which the chip is bonded, a plating protective film having an opening at a position which is on the front surface of the chip and corresponds to an electrode at which plating is to be formed, after the bonding.

The semiconductor device manufacturing method may include plating the electrode of the chip after the providing.

The semiconductor device manufacturing method may include removing the plating protective film from the substrate, after the plating.

(Item 2)
In the providing, a first film may be pasted as the plating protective film.

In the removing, the first film may be peeled off from the substrate.

(Item 3)
In the providing, a second film may be pasted onto a rear surface of the substrate.

In the removing, the second film may be further peeled off from the rear surface of the substrate.

(Item 4)
In the providing, the first film and the second film may be adhered to each other at a peripheral portion of an edge portion of the substrate.

(Item 5)
The semiconductor device manufacturing method may include forming a plurality of the chips on a wafer.

The semiconductor device manufacturing method may include dicing the wafer on which the plurality of chips are formed.

In the bonding, a rear surface of the chip divided into pieces by dicing may be bonded to the front surface of the substrate.

(Item 6)
The forming a plurality of the chips may have forming a chip protective film on a periphery of the electrode at the front surface of the chip.

In the providing, a portion surrounding the opening of the film may be pasted onto the chip protective film at the periphery of the electrode.

(Item 7)
The forming a plurality of the chips may have forming a chip protective film on a periphery of the electrode at the front surface of the chip.

The semiconductor device manufacturing method may include forming a chip surrounding-portion protective film to cover a peripheral portion of the chip in the substrate after the bonding.

In the providing, a portion surrounding the opening of the film may be pasted onto the chip surrounding-portion protective film.

(Item 8)
In the bonding, the rear surface of the chip may be solder-bonded to the front surface of the substrate without using a flux material.

(Item 9)

The chip protective film may be, at the periphery of the electrode, thicker than the electrode after plating.

(Item 10)

The chip protective film may contain polyimide as a principal component thereof.

(Item 11)

A semiconductor device may include a substrate.

The semiconductor device may include a chip that has electrodes on both sides thereof, and has a rear surface bonded to a front surface of the substrate.

The semiconductor device may include a chip protective film to cover a periphery of the electrode at a front surface of the chip.

The semiconductor device may include a chip surrounding-portion protective film to cover a peripheral portion of the chip in the substrate.

The semiconductor device may include a plating film provided on the electrodes of the chip.

(Item 12)

The electrodes of the chip may have films containing Al.

The plating film may contain Ni or Cu.

(Item 13)

The plating film may have an Au film on a surface thereof.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
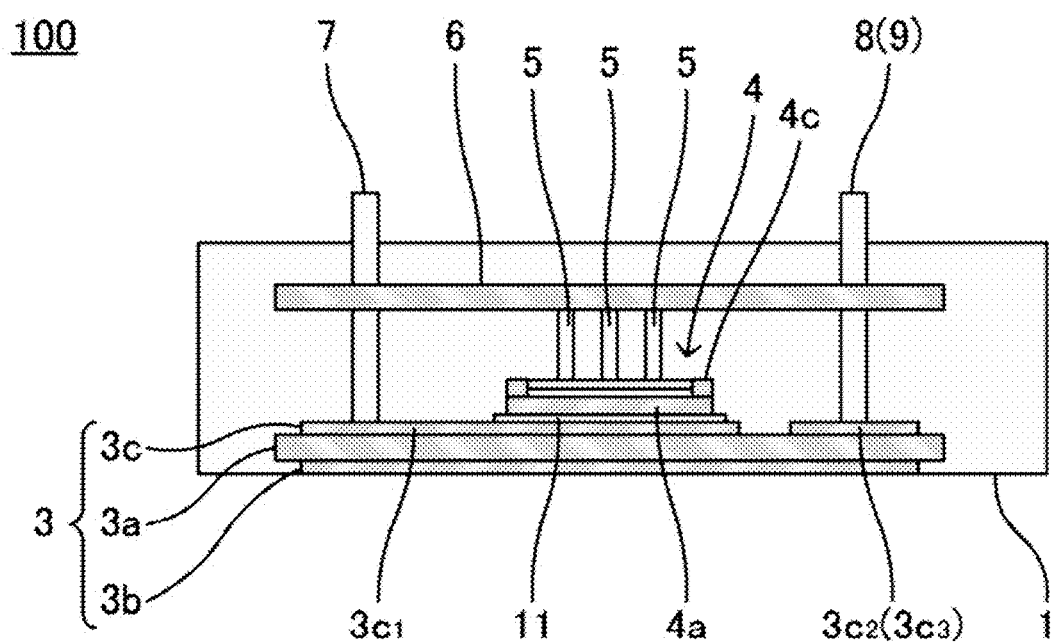
FIG. 1 shows the sectional configuration of a semiconductor device according to the present embodiment.

FIG. 1 shows the sectional configuration of a semiconductor device 100 according to the present embodiment as seen from a side thereof. In the configuration diagrams such as FIG. 1, the upper side and lower side of the figures are treated as the front side and rear side, respectively. The semiconductor device 100: includes a semiconductor element in which a metal layer with a larger film thickness is provided at a front surface electrode by plating, but a chip is less warped; and has a main body 1, a substrate 3, a semiconductor element 4, conductive posts 5, a wiring substrate 6 and external terminals 7 to 9.

The main body 1 is a member that seals in respective constituent portions of the semiconductor device 100, while the upper ends of the external terminals 7 to 9 project therefrom upward, and the lower surface of the substrate 3 is exposed flush with the bottom surface of the main body 1. The main body 1 is formed into a rectangular parallelepiped shape by molding a thermosetting resin such as an epoxy resin, for example.

The substrate 3 is a substrate on which the semiconductor element 4 is mounted, and a DCB (Direct Copper Bonding) substrate, an AMB (Active Metal Brazing) substrate or the like can be used as the substrate 3, for example. The substrate 3 includes an insulating plate 3a, a metal layer 3b and a wiring layer 3c. The insulating plate 3a is a tabular member configured to be 0.2 to 1 mm-thick, for example, with insulative ceramics such as aluminum nitride, silicon nitride or aluminum oxide, for example. The metal layer 3b is formed using a conductive metal such as copper or aluminum, is provided to the lower surface of the insulating plate 3a, and has a film thickness of 0.1 to 1 mm, for example. For the rust prevention purpose or other purposes, a surface of the metal layer 3b may be subjected to plating using nickel or the like. The wiring layer 3c is formed using a conductive metal such as copper or aluminum, in a manner similar to that for the metal layer 3b and is provided to the upper surface of the insulating plate 3a.

The wiring layer 3c of the substrate 3 has three wiring patterns $3c_1$, $3c_2$ and $3c_3$. The wiring pattern $3c_1$ is arranged at a predetermined position in a region which is on the insulating plate 3a and occupies the left approximately two-thirds of the figure. On the wiring pattern $3c_1$, the semiconductor element 4 mentioned below is mounted. The wiring patterns $3c_2$ and $3c_3$ are arranged in parallel in a region which is on the insulating plate 3a and occupies the right approximately one-third of the figure. However, the wiring pattern $3c_3$ is positioned on the far side of the figure relative to the wiring pattern $3c_2$.

The semiconductor element 4 is for example a switching element consisting of a compound semiconductor such as SiC, and a vertical metal-oxide semiconductor field-effect transistor (MOSFET), an insulated gate bipolar transistor (IGBT) or the like having electrodes on both the front surface and the rear surface can be used as the semiconductor element 4. The semiconductor element 4, if it is an IGBT (or MOSFET), has an emitter electrode (or a source electrode) and a gate electrode on its front surface, a guard ring at its edge portion, and a collector electrode (or a drain electrode) on its rear surface (none of them are illustrated). A chip protective film 4c is formed at the periphery of the front surface of the semiconductor element 4. The semiconductor element 4 is bonded to the front surface of the substrate 3 at its rear surface by the collector electrode (or the drain electrode) being connected to the wiring pattern $3c_1$ of the wiring layer 3c with a bonding material 11 such as solder. In the present embodiment, a MOSFET is used as the semiconductor element 4, as one example.

Diode elements such as a free wheel diode (FWD) or a Schottky barrier diode (SBD) may be mounted on the substrate 3 and connected in anti-parallel with the semiconductor element 4 to constitute a switching apparatus.

The conductive posts 5 are conductive members that are provided between the semiconductor element 4 and the wiring substrate 6 and are for transmitting electricity therebetween. As one example, they are formed into a columnar shape such as a cylindrical shape using a conductive metal such as copper or aluminum. The conductive posts 5 are vertically arranged on the semiconductor element 4 by their lower ends being connected to the semiconductor element 4 with a bonding material such as solder (not illustrated), and are connected at their upper ends to a wiring layer of the wiring substrate 6 by soldering, brazing or caulking.

The conductive posts 5 include a plurality of posts, and three posts here as one example. Two posts among them are vertically arranged on the emitter electrode of the semiconductor element 4, and connect to the wiring layer of the wiring substrate 6. The one remaining post is vertically arranged on the gate electrode of the semiconductor element 4, and connects to the wiring layer of the wiring substrate 6.

The wiring substrate 6 is a substrate on which wires to connect the electrodes of the semiconductor element 4 to the external terminals 7 to 9 are provided. The wiring substrate 6 has an insulating plate and a wiring layer in which circuit patterns are formed on its front surface or rear surface (none of them are illustrated). For example, a rigid substrate constituted with a glass epoxy material or the like or a flexible substrate constituted with a polyimide material or the like can be used as the insulating plate. The wiring substrate 6 is provided with a plurality of through-holes (not illustrated) through which the conductive posts 5 and external terminals 7 to 9 are inserted. The wiring layer is provided to a surface of the insulating plate using a conductive metal such as copper or aluminum.

The external terminals 7, 8 and 9 are, respectively, input and output terminals for inputting and outputting current output from the semiconductor element 4 out of the semiconductor device 100, and a control terminal through which controls signals are input to the semiconductor element 4 from the outside of the semiconductor device 100. The external terminals 7 to 9 are formed into a columnar shape such as a cylindrical shape using a conductive metal such as copper or aluminum, in a manner similar to that for the conductive posts 5. The external terminal 7 is vertically arranged on the wiring pattern $3c_1$ of the wiring layer 3c and connects to the collector electrode of the semiconductor element 4 therethrough. The external terminal 8 is vertically arranged on the wiring pattern $3c_2$ of the wiring layer 3c, and connects to the emitter electrode of the semiconductor element 4 through the wiring pattern $3c_2$, the wiring substrate 6 and a conductive post 5. The external terminal 9 is vertically arranged on the wiring pattern $3c_3$ of the wiring layer 3c, and connects to the gate electrode of the semiconductor element 4 through the wiring pattern $3c_3$, the wiring substrate 6 and a conductive post 5. The external terminals 7 to 9 are vertically arranged on a wiring pattern with a bonding material such as solder (not illustrated), and their tip ends project out of the main body 1 through through-holes (not illustrated) of the wiring substrate 6.

A semiconductor device 100 manufacturing method is explained.

Figure 2:
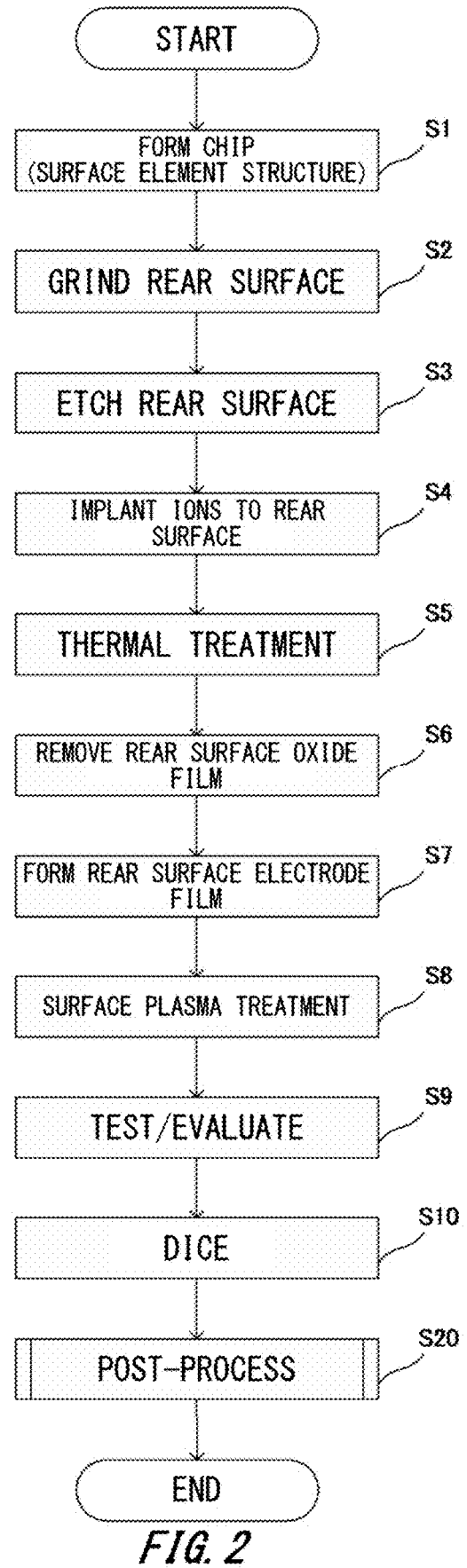
FIG. 2 shows a semiconductor device manufacturing flow.

FIG. 2 shows a semiconductor device 100 manufacturing flow.

At Step S1 (chip formation step), a plurality of chips are formed on a semiconductor substrate (called a wafer). For example, an n-semiconductor substrate consisting of an FZ substrate is used as a wafer, and for example a $p^+$-base region, an $n^+$-emitter region, a gate oxide film, a gate electrode, an emitter electrode, an interlayer dielectric film and the like are formed on the front surface of the wafer. Here, the gate electrode and emitter electrode (which are examples of electrodes, and collectively called front surface electrodes) are formed by forming a film of aluminum (Al) or the like on a wafer front surface. Thereby, an element structure including a plurality of semiconductor elements 4 is formed on the wafer.

Furthermore, a chip protective film is formed on the front surface of the wafer. The chip protective film is formed on the peripheries of the front surface electrodes of each chip by applying a film material containing polyimide as its principal component, for example, onto the peripheries of the front surface electrodes so as to expose their middles, and heating and curing it in a nitrogen atmosphere. Here, the film thickness of the chip protective film at the peripheries of the front surface electrodes is assumed to be larger than the thickness of the electrodes after plating mentioned below. By providing the chip protective film, it becomes possible to reduce load that is generated due to pressure and heat applied onto a chip when a plating protective film mentioned below is provided onto the substrate to which the chip is bonded.

A plasma treatment onto a wafer surface is performed after forming the chip protective film. Thereby, deposits such as organic substances are removed from the wafer surface so that it becomes easier to form a plating film at the time of plating, and additionally end portions of the chip protective film are scraped and contact angles become smaller so that it becomes possible to form the plating film at the interface between the plating film and the chip protective film with no gap therebetween.

In addition, formation of the chip protective film is not limited to being executed at the chip formation step, but may be performed at any step before the post-process. Thereby, if the heating temperature for curing the chip protective film (for example, 350° C.) is higher than the melting temperature of a bonding material such as solder in the post-process when it is allowed to reflow, the bonding material never melts unnecessarily due to the curing of the chip protective film. Because of the relationship between the heating temperature for curing the chip protective film and the temperature at a subsequent thermal treatment, if, for example, the heating temperature at the curing is higher than the temperature at the thermal treatment, the chip protective film is formed before the thermal treatment, and if the temperatures are approximately the same or the former is lower than the latter, the chip protective film may be formed after the thermal treatment. In addition, depending on the thickness of the wafer, for example, if the wafer is thick, the chip protective film may be formed at a latter step, and if the wafer is thin, the chip protective film may be formed at an earlier step, in particular, before a rear surface grinding step.

At Step S2, the rear surface of the wafer is ground (back-ground). Thereby, the thickness of the wafer becomes approximately 150 μm, for example.

At Step S3, the rear surface of the wafer is etched. The etching may be either wet etching or dry etching. Thereby, the thickness of the wafer becomes approximately 130 μm, damages to the wafer that are generated during the rear surface grinding at Step S2 are removed and additionally stress to be applied to the wafer is reduced.

At Step S4, after the wafer is washed, p-type and n-type ions are implanted sequentially onto the rear surface of the wafer.

At Step S5, the wafer is subjected to thermal treatment (for example, 350 to 900° C.). Thereby, the ions implanted at Step S4 are activated, and an n-buffer layer and a $p^+$-collector layer are formed on the rear surface of the wafer.

At Step S6, a rear surface oxide film of the wafer is removed. Here, for example, dilute hydrofluoric acid (HF) can be used. Thereby, a surface cured layer such as an oxide film formed on a surface of the $p^+$-collector layer is removed.

At Step S7, a film of an electrode is formed on the rear surface of the wafer. Here, an aluminum layer, a titanium layer, a nickel layer and a gold layer are laminated on a surface of the $p^+$-collector layer by evaporation or sputtering to form a collector electrode as a rear surface electrode. The collector electrode is provided over the entire rear surface of the wafer.

At Step S8, a wafer surface is subjected to plasma treatment. Thereby, deposits such as organic substances deposited onto the wafer surface are removed. The plasma treatment on the surface may executed not on a wafer-by-wafer basis, but on a chip-by-chip basis. For example, a surface of a chip (that is, a semiconductor element) may be subjected to the plasma treatment with the chip being mounted on a substrate at a subsequent assembling step.

At Step S9, a plurality of element structures formed on the wafer are tested and evaluated on a chip-by-chip basis. Thereby, the plurality of element structures are each sorted as being good or bad.

At Step S10 (dicing step), the wafer is diced. Thereby, the plurality of element structures are each divided into a piece of a chip to form semiconductor elements 4.

At Step S20, the post-process is performed, that is, the semiconductor elements 4 are mounted on the substrate 3 to assemble the semiconductor device 100.

Figure 3:
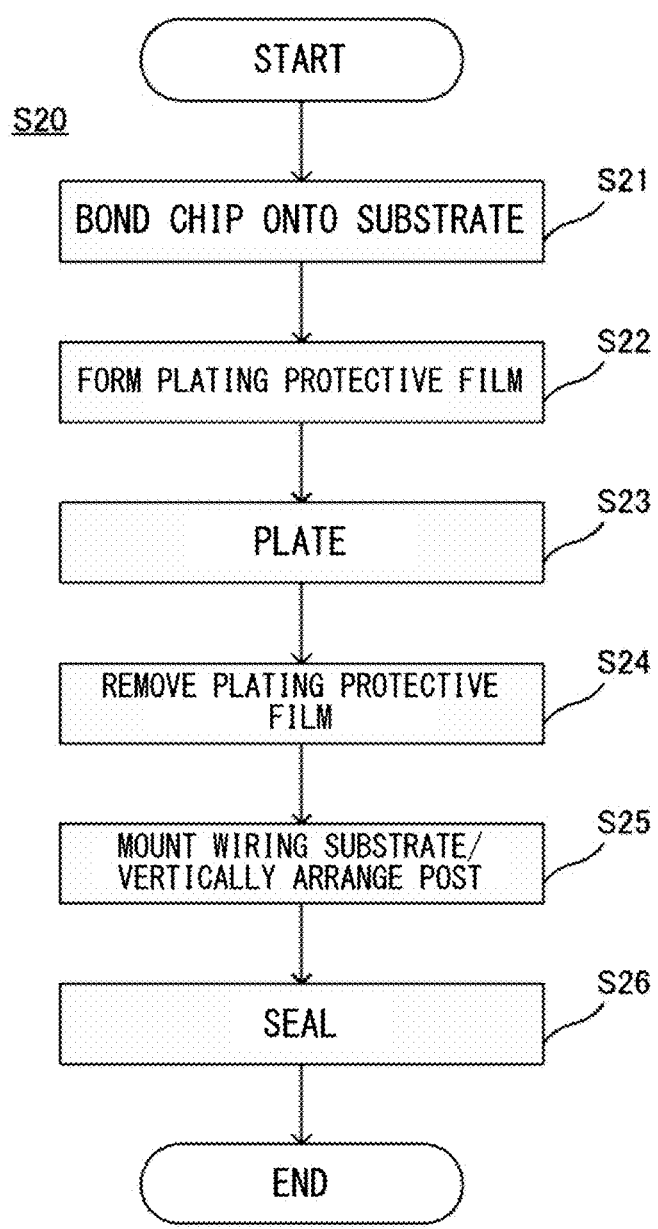
FIG. 3 shows a flow of a semiconductor device assembling step (post-process).

FIG. 3 shows a flow of a semiconductor device 100 assembling step (post-process).

Figure 4A:
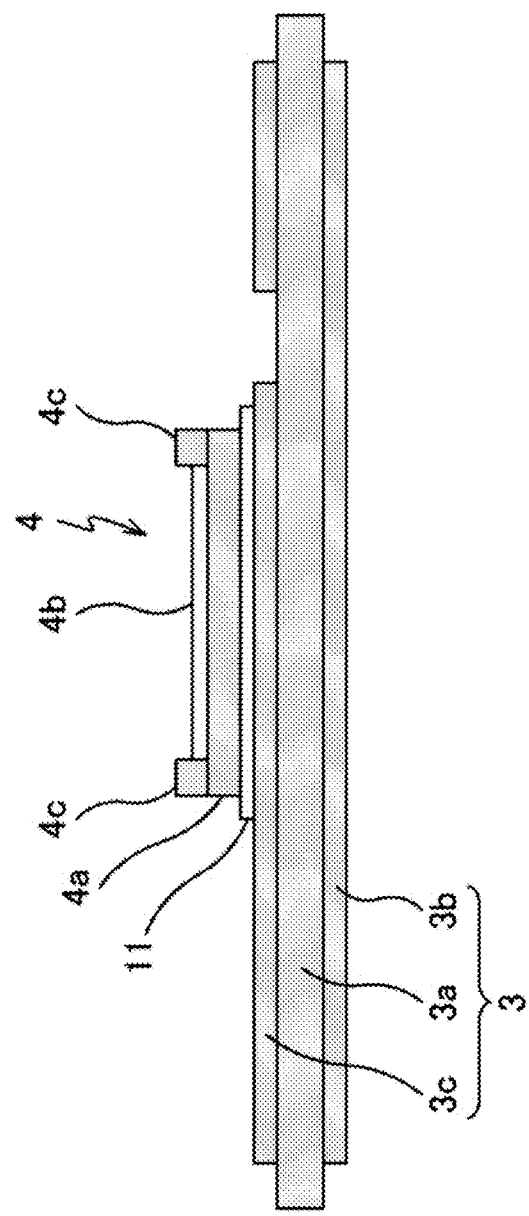
FIG. 4A shows the state where a chip is bonded onto a substrate after a chip bonding step.

At Step S21 (bonding step), a chip 4a (that is, a semiconductor element 4) having electrodes on both sides thereof is bonded onto the front surface of the substrate 3. Here, the semiconductor element 4 has a front surface electrode (a gate electrode and an emitter electrode) 4b formed as a film on a surface of the chip 4a and a chip protective film 4c formed at the periphery of the surface, after the pre-process at Steps S1 to S10. A rear surface electrode (a collector electrode) of the chip 4a (the semiconductor element 4) is bonded onto the wiring layer 3c (that is, the wiring pattern $3c_1$) of the substrate 3 through the bonding material 11 such as solder as shown in FIG. 4A.

At Step S22 (plating protective film formation step), a plating protective film 12 is provided on the substrate 3. The plating protective film 12 is a protective film for preventing a plating bath from infiltrating into the substrate 3 at a plating step mentioned below, and has a first film 12a to cover the front side of the substrate 3 and a second film 12b to cover the rear side of the substrate 3. Here, the first film 12a has an opening $12a_0$ through which a position corresponding to a region at which a plating film on the front surface electrode 4b of the chip 4a should be formed, that is, an inner region excluding the periphery of the front surface electrode 4b is exposed.

The first and second films 12a, 12b include film base materials and adhesive layers, and the film base materials attach to substrate surfaces through the adhesive layers. Here, the film base materials are desirably base materials that are elastic, chemical-resistant against a plating bath and heat-resistant (for example, about 100° C.), and for example are any of polyimide films, polyolefin films, polycarbonate films, vinyl chloride films, polypropylene films, ABS films, polyethylene terephthalate films (PET), nylon films and polyurethane films. Thereby, it is possible to cover the uneven substrate 3 with no gap therebetween, and to protect the substrate 3 from a plating bath. In addition, for example, adhesives having adhesive force which lowers due to irradiation with ultraviolet (UV) light can be used as the adhesive layers. Pressure-sensitive adhesives may be used if the film base materials and adhesives are not left on the substrate 3 after a protective film is peeled at a plating protective film peeling step mentioned below.

Figure 4B:
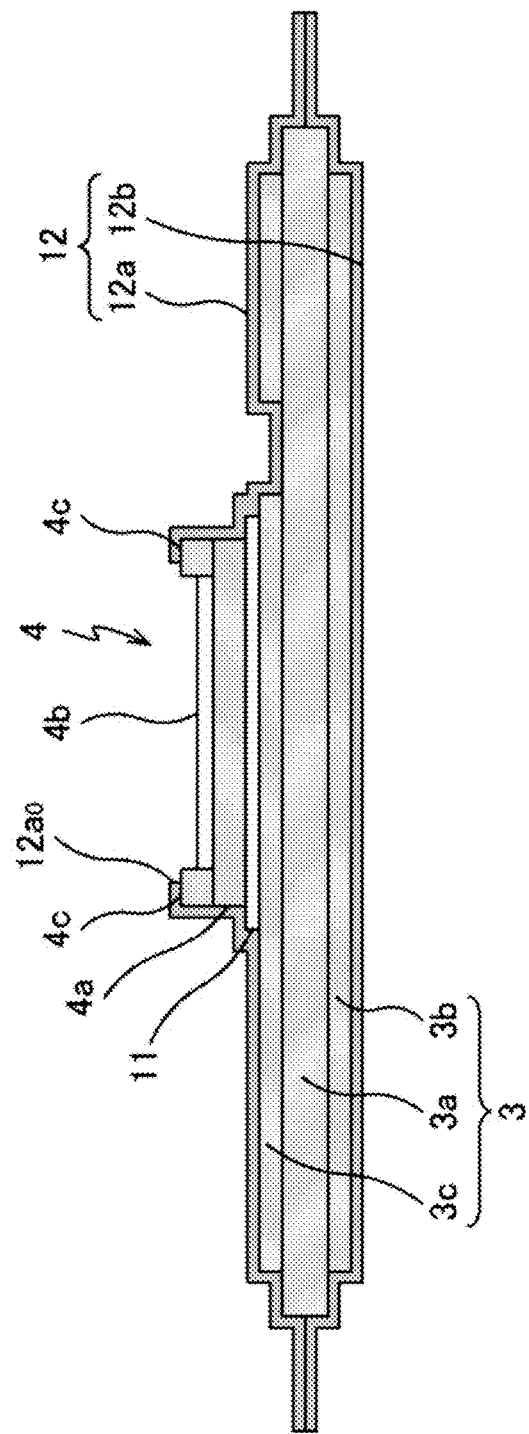
FIG. 4B shows the state where a plating protective film is provided on the substrate after a plating protecting step.

The plating protective film 12 covers the substrate 3 except for the front surface electrode 4b of the chip 4a as shown in FIG. 4B. First, the first film 12a, entirely except for an edge portion thereof, is pasted onto the front surface of the substrate 3 to which the chip 4a is bonded, by positioning the opening $12a_0$ at the middle of the front surface electrode 4b and pasting a portion surrounding the opening $12a_0$ of the first film 12a onto the chip protective film 4c at the periphery of the front surface electrode 4b. Next, the second film 12b, except for an edge portion thereof, is pasted onto the rear surface of the substrate 3. Last, respective edge portions of the first and second films 12a, 12b are adhered to each other at peripheral portions at edge portions of the substrate 3. The order of pasting the first and second films 12a, 12b to the substrate 3 may be any order or they may be pasted simultaneously. In addition, it is possible to further prevent infiltration of a plating bath by providing the plating protective film 12 to the substrate 3 in a reduced-pressure atmosphere and bringing the pressure back to the pressure of the atmosphere, because due to the pressure of the atmosphere, the first and second films 12a, 12b closely adhere to the substrate 3 deep into inner parts of corner portions that are generated because of steps at the wiring layer or the like.

The plating protective film 12 may consist of two films not having the opening $12a_0$ which are to be pasted onto the front surface and rear surface of the substrate 3, respectively, or the substrate 3 is sealed in a bag-like film and an opening through which the front surface electrode 4b of the chip 4a is exposed may be provided on the front surface electrode 4b.

Figure 4C:
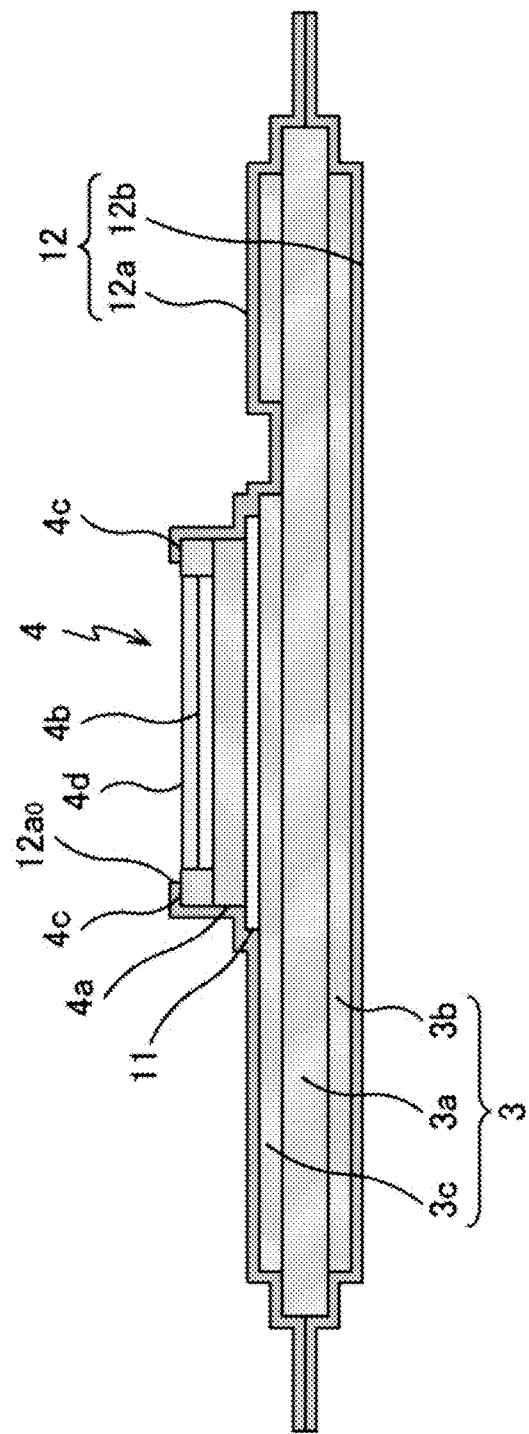
FIG. 4C shows the state where a plating film is provided on a front surface electrode of the chip after a plating step.

At Step S23 (plating step), the front surface electrode 4b of the chip 4a is plated. In the present embodiment, electroless plating is performed as one example. In electroless plating, the substrate 3 covered by the plating protective film 12 except for the front surface electrode 4b of the chip 4a is immersed in a plating bath for an appropriate length of time. Thereby, as shown in FIG. 4C, a metal species contained in the plating bath, for example, nickel (Ni), gold (Au) or copper (Cu) is deposited on the front surface electrode 4b, and a plating film 4d with a thickness of several micrometers to several tens micrometers, for example, is provided. In this manner, by executing plating on a chip-by-chip basis, that is, in a state where the chip 4a (semiconductor element 4) is bonded onto the substrate 3 and is reinforced at its rear surface side, the chip 4a becomes less warped as compared with a case where plating is performed on a wafer-by-wafer basis so that the film thickness of the plating film 4d can be increased.

The plating film 4d is not limited to one consisting of a single layer, but may consist of a plurality of layers. For example, a gold (Au) film may be provided on a nickel (Ni) film. In addition, other examples of metal species that can be applied to form a plating film include electroless nickel-phosphorus alloy plating, displacement gold plating, electroless gold plating, electroless nickel-palladium-phosphorus alloy plating, electroless nickel-boron alloy plating, electroless nickel-phosphorus-PTFE (fluororesin) composite plating, electroless nickel-boron-graphite composite plating, electroless copper plating, electroless silver plating, electroless palladium plating, electroless platinum plating, electroless rhodium plating, electroless ruthenium plating, electroless cobalt plating, electroless cobalt-nickel alloy plating, electroless cobalt-nickel-phosphorus alloy plating, electroless cobalt-tungsten-phosphorus alloy plating, electroless cobalt-tin-phosphorus alloy plating, electroless cobalt-zinc-phosphorus alloy plating, electroless cobalt-manganese-phosphorus alloy plating, electroless tin plating, and electroless solder plating.

At Step S24 (plating protective film removal step), the plating protective film 12 is removed from the substrate 3.

First, the plating protective film 12 covering the substrate 3 is irradiated with UV light. Here, both the first and second films 12a, 12b of the plating protective film 12 may be irradiated with UV light simultaneously or sequentially. UV light used is desirably black light fluorescent light with a peak wavelength of about 365 nm, for example. Thereby, the adhesive layers of the first and second films 12a, 12b are cured and their adhesive force lowers. If pressure-sensitive adhesives are used as the adhesive layers of the first and second films 12a, 12b, irradiation with UV light is not performed.

Figure 4D:
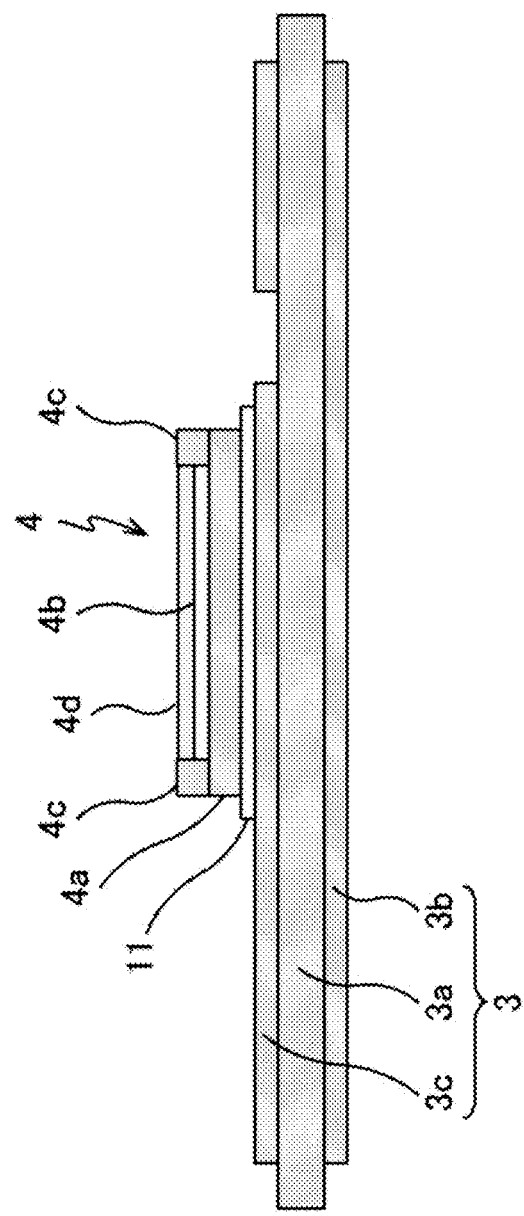
FIG. 4D shows the state where the plating protective film is removed from the substrate after a plating protection removal step.

Next, the plating protective film 12 is peeled off from the substrate 3. Here, by attaching a peeling tape onto an edge portion of one of the first and second films 12a, 12b of the plating protective film 12 and pulling it up at an appropriate strength and speed, one of the films can be peeled off from the other film and further can be peeled off from the substrate 3 without leaving adhesives. Likewise, the other film is peeled off from the substrate 3 using a peeling tape. Thereby, the plating protective film 12 is removed from the substrate 3 as shown in FIG. 4D.

Figure 5A:
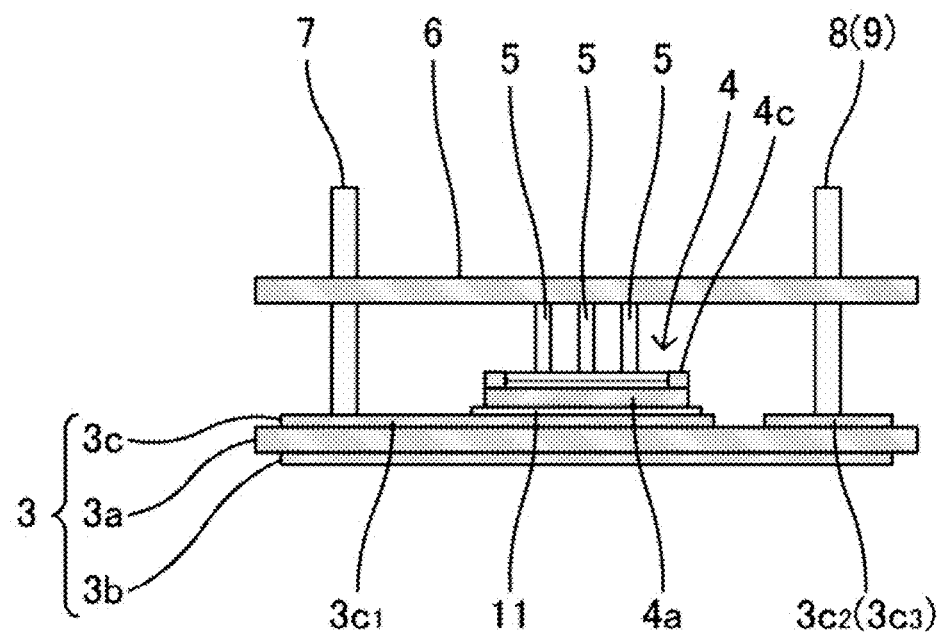
FIG. 5A shows the state where a wiring substrate is mounted on the substrate and a post is vertically arranged after a wiring substrate mounting post vertically arranging step.

At Step S25, the wiring substrate 6 is mounted on the substrate 3, and additionally the conductive posts 5 are vertically arranged on the front surface electrode of the semiconductor element 4. First, the conductive posts 5 and the external terminals 7 to 9 are inserted into a plurality of through-holes (not illustrated) of the wiring substrate 6. Next, the wiring substrate 6 is supported on the substrate 3. Thereby, the conductive posts 5 are vertically arranged on the front surface electrode of the semiconductor element 4 through a bonding material (not illustrated) such as solder, and the external terminals 7 to 9 are vertically arranged on the wiring patterns $3c_1$ to $3c_3$ of the wiring layer $3c$, respectively, through a bonding material (not illustrated) such as solder. Last, by causing the bonding materials to reflow using a reflow furnace, the semiconductor element 4 is bonded onto the wiring pattern $3c_1$ of the substrate 3 as shown in FIG. 5A, the lower ends of the external terminals 7 to 9 are bonded onto the wiring patterns $3c_1$ to $3c_3$ of the substrate 3, respectively, and the lower ends of the conductive posts 5 are bonded onto the front surface electrode of the semiconductor element 4.

The reflow furnace utilized can be a H2 reflow furnace (highest furnace temperature=approximately 320° C.) if plate solder is used as a bonding material, and an N2 reflow furnace (highest furnace temperature=approximately 280° C.) if flux-containing solder is used. In addition, if solder is used as a bonding material, preferably it is lead-free solder such as Sn—Ag—Cu-based, Sn—Sb based, Sn—Sb—Ag based, Sn—Cu-based, Sn—Sb—Ag—Cu-based, Sn—Cu—Ni based or Sn—Ag based solder, for example.

Figure 5B:
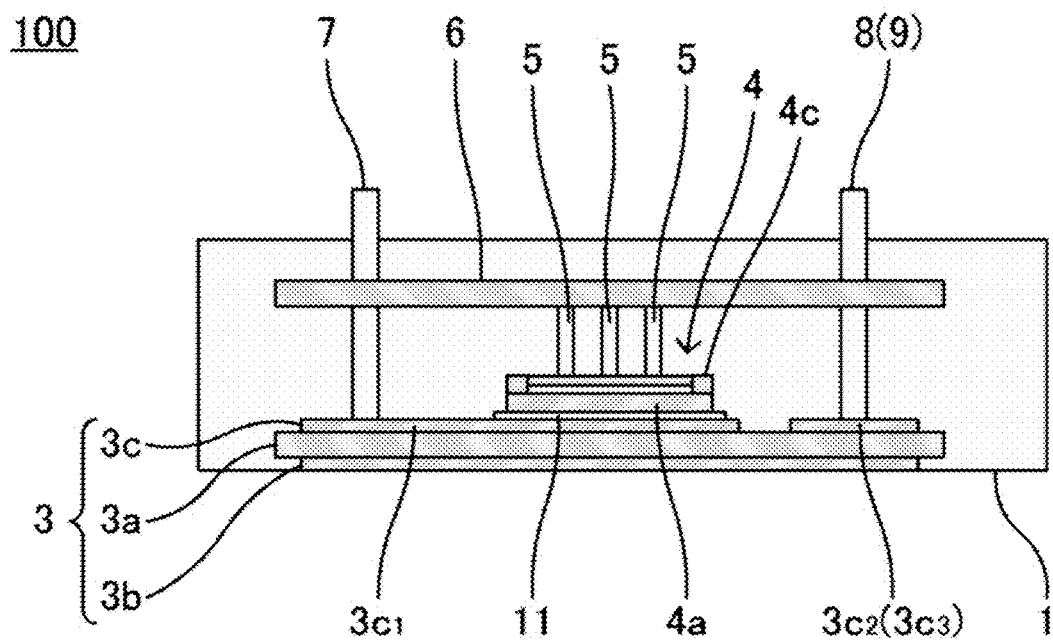
FIG. 5B shows the state where a semiconductor element is sealed in a main body after a sealing step.

At Step S26, the substrate 3 to which the chip 4a (semiconductor element 4) is bonded is sealed in. By performing molding using thermosetting resin as shown in FIG. 5B, the substrate 3, semiconductor element 4, conductive posts 5, wiring substrate 6 and external terminals 7 to 9 are sealed in the main body 1. In this manner, the semiconductor device 100 is configured.

Figure 6:
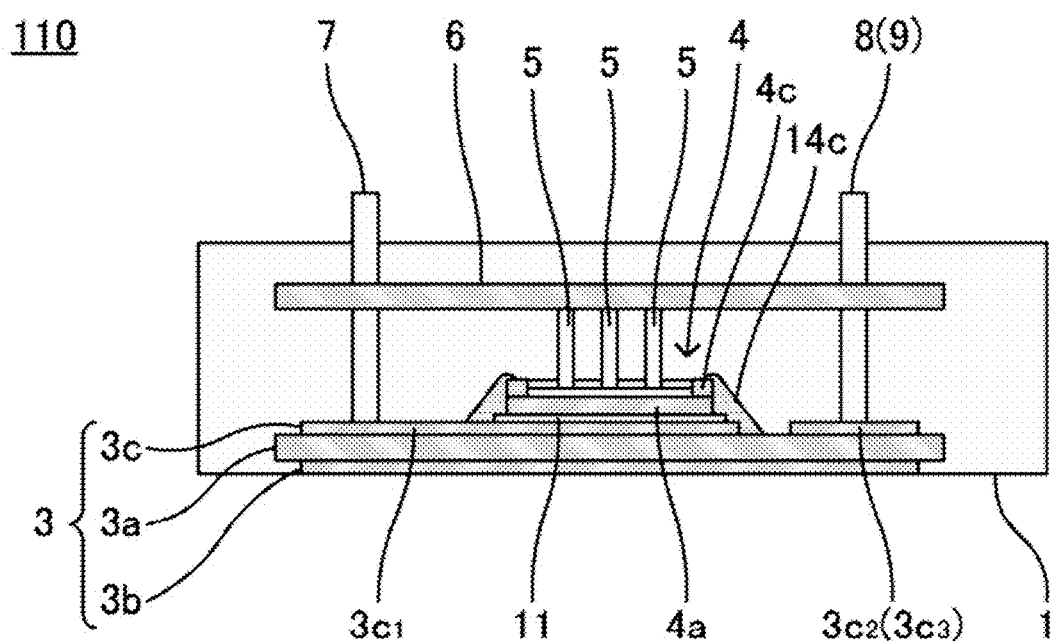
FIG. 6 shows the sectional configuration of a semiconductor device according to a variant.

FIG. 6 shows the sectional configuration of a semiconductor device 110 according to a variant as seen from a side thereof. The semiconductor device 110 includes: a semiconductor element in which a metal layer with a larger film thickness is provided at a front surface electrode by plating, but a chip is less warped; and has the main body 1, substrate 3, semiconductor element 4, conductive posts 5, wiring substrate 6 and external terminals 7 to 9 which are the same as those in the above-mentioned semiconductor device 100. However, in order to protect the chip 4a constituting the semiconductor element 4 bonded onto the substrate 3, a chip surrounding-portion protective film 14c to cover peripheral portions of the chip 4a in the substrate 3 is further formed in the semiconductor element 4, in addition to the chip protective film 4c formed at the periphery of the front surface electrode at the front surface of the chip 4a.

A semiconductor device 110 manufacturing method is explained.

The semiconductor device 110 is manufactured in a flow similar to the semiconductor device 100 manufacturing flow shown in FIG. 2. In view of this, explanation of common steps is omitted.

The chip 4a to constitute the semiconductor element 4 is formed at Steps S1 to S10 mentioned above. However, Step S20 of assembling the semiconductor device 100 is replaced with Step S120 mentioned below.

Figure 7:
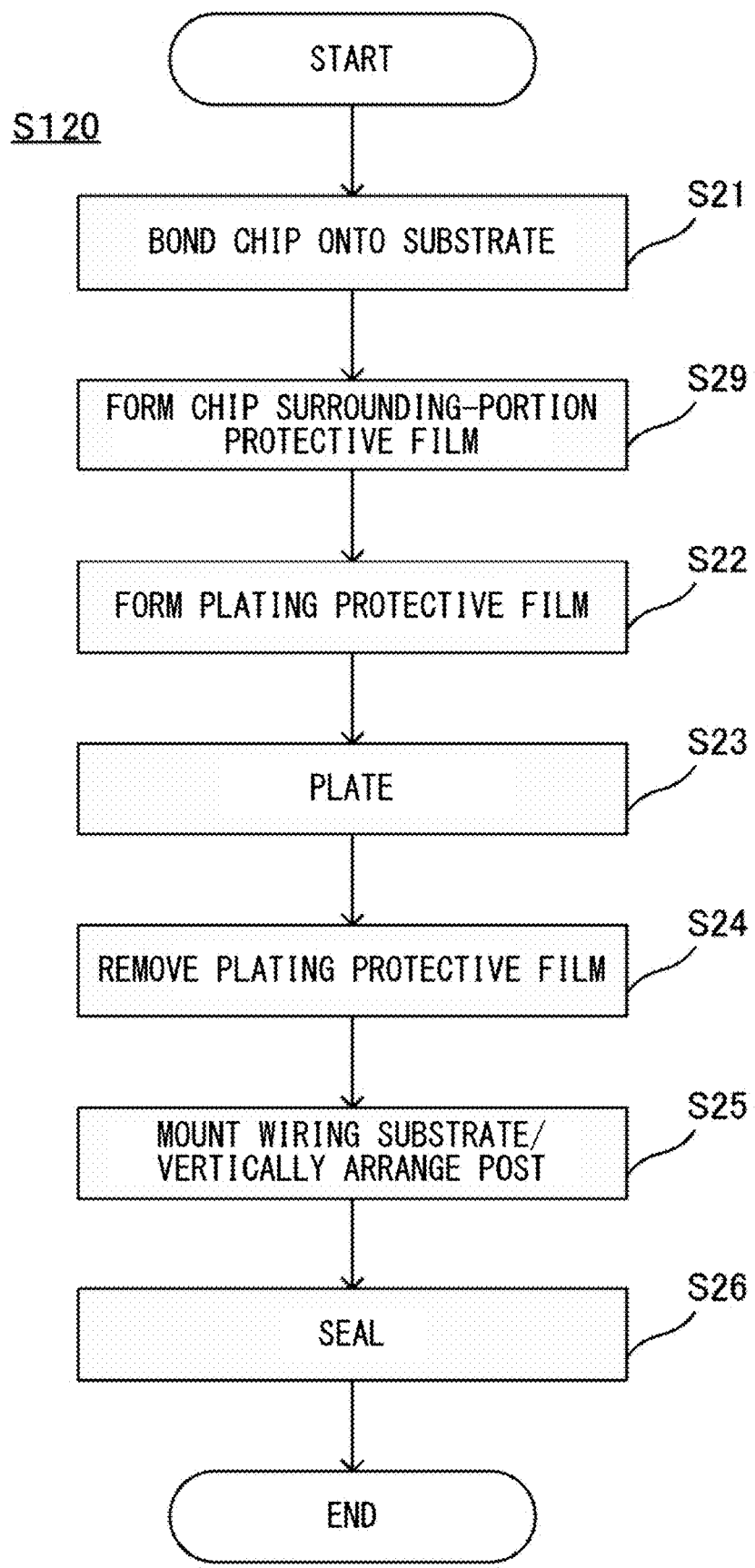
FIG. 7 shows a flow of a semiconductor device assembling step (post-process) according to the variant.

FIG. 7 shows a flow of a semiconductor device 110 assembling step (post-process) S120 according to the variant. Because respective steps included in Step S120 are almost the same as the steps included in Step S20 mentioned above, corresponding steps are given the same reference symbols, and only different portions in different steps are explained.

At Step S21 (bonding step), as shown in FIG. 8, the chip 4a (that is, the semiconductor element 4) having electrodes on both sides thereof is bonded onto the front surface of the substrate 3. However, because the chip surrounding-portion protective film 14c is heated and cured for example at 350° C. at Step S29 (chip surrounding-portion protective film forming step) mentioned below, the rear surface of the chip 4a is solder-bonded to the front surface of the substrate 3 without using a flux material. Thereby, the chip surrounding-portion protective film 14c can be formed without burning of solder.

Figure 8A:
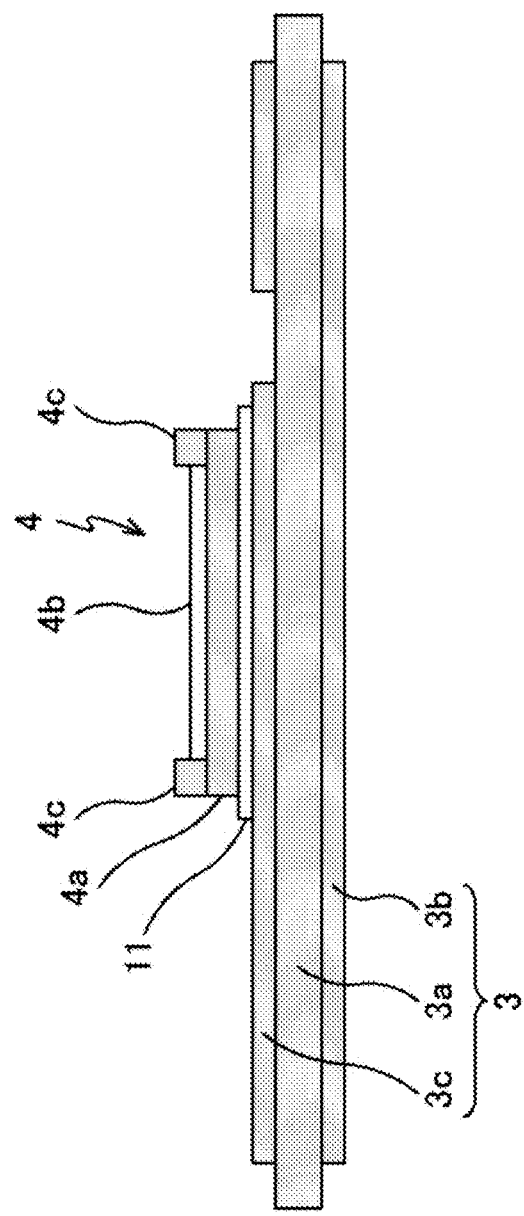
FIG. 8A shows the state where a chip is bonded onto a substrate after a chip bonding step.
Figure 8B:
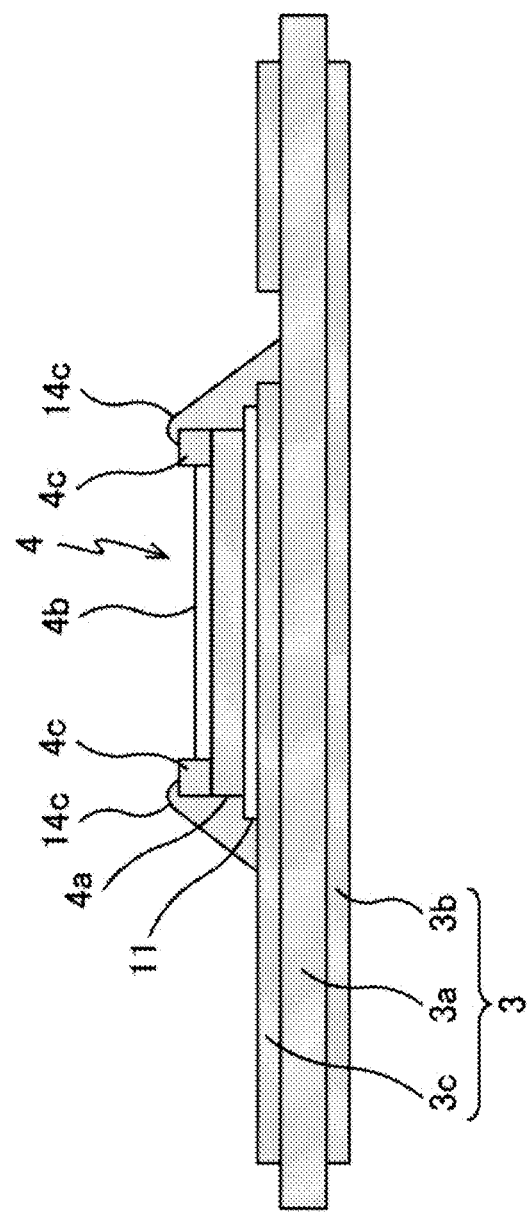
FIG. 8B shows the state where a chip surrounding-portion protective film to cover the periphery of a front surface electrode of the chip and a peripheral portion of the chip is provided after a chip surrounding-portion protective film forming step.

At the following Step S29 (chip surrounding-portion protective film forming step), the chip surrounding-portion protective film 14c is formed on the chip 4a on the substrate 3. The chip surrounding-portion protective film 14c is formed to cover peripheral portions of the chip 4a as shown in FIG. 8B by applying a film material containing polyimide as its principal component for example onto the peripheral portions of the chip 4a in the substrate 3 including at least a part of the upper surface (here, the periphery of the upper surface) of the chip protective film 4c formed at the periphery of the front surface electrode 4b at the front surface of the chip 4a and heating and curing it in a nitrogen atmosphere. By providing the chip surrounding-portion protective film 14c in addition to the chip protective film 4c, it becomes possible not only to reduce load due to pressure and heat applied onto the chip 4a when the plating protective film 12 mentioned below is provided onto the substrate 3 to which the chip 4a is bonded, but also to suppress contamination of the bonding material 11 such as solder due to infiltration of a plating bath (including for example a pre-plating solution and a post-plating solution) at the time of plating on the front surface electrode 4b mentioned below.

Figure 8C:
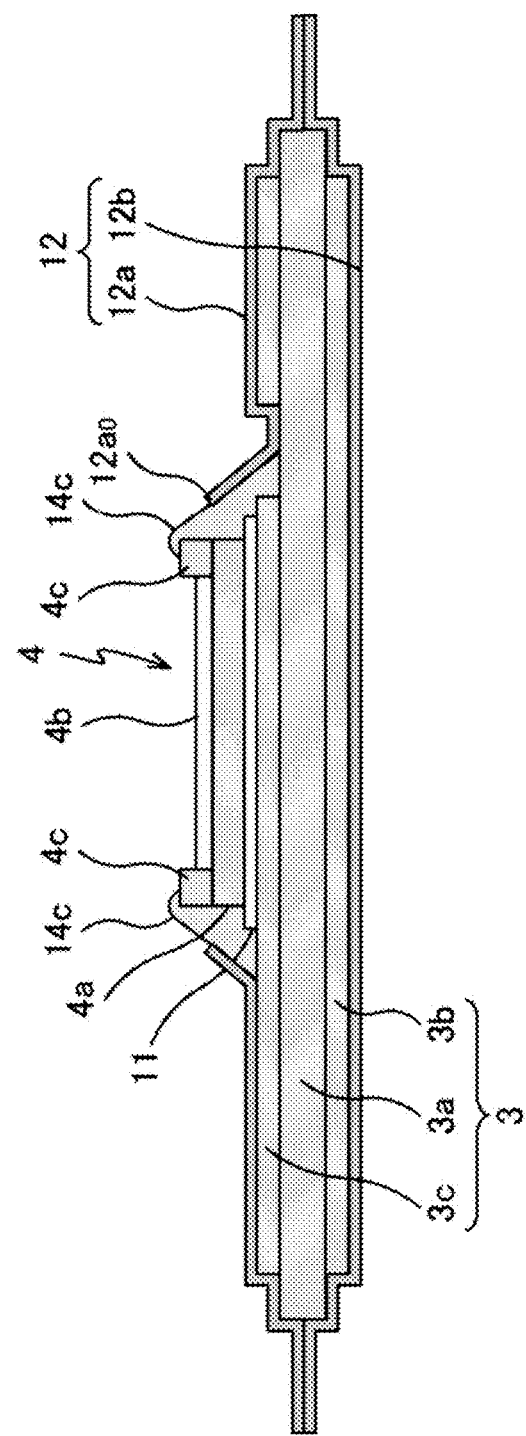
FIG. 8C shows the state where a plating protective film is provided on the substrate after a plating protective film formation step.

At Step S22 (plating protective film formation step), the plating protective film 12 is provided on the substrate 3. The plating protective film 12 is a protective film for preventing a plating bath from infiltrating into the substrate 3 at a plating step mentioned below, and has the first film 12a to cover the front side of the substrate 3 and the second film 12b to cover the rear side of the substrate 3. Here, the first film 12a has the opening $12a_0$ that exposes the inner side of the chip surrounding-portion protective film 14c and the front surface electrode 4b. The plating protective film 12 has portions surrounding the opening $12a_0$ that are pasted onto the chip surrounding-portion protective film 14c as shown in FIG. 8C and covers the substrate 3 except for the inner side of the chip surrounding-portion protective film 14c and the front surface electrode 4b. Details thereof are the same as those for Step S22 mentioned above.

Figure 8D:
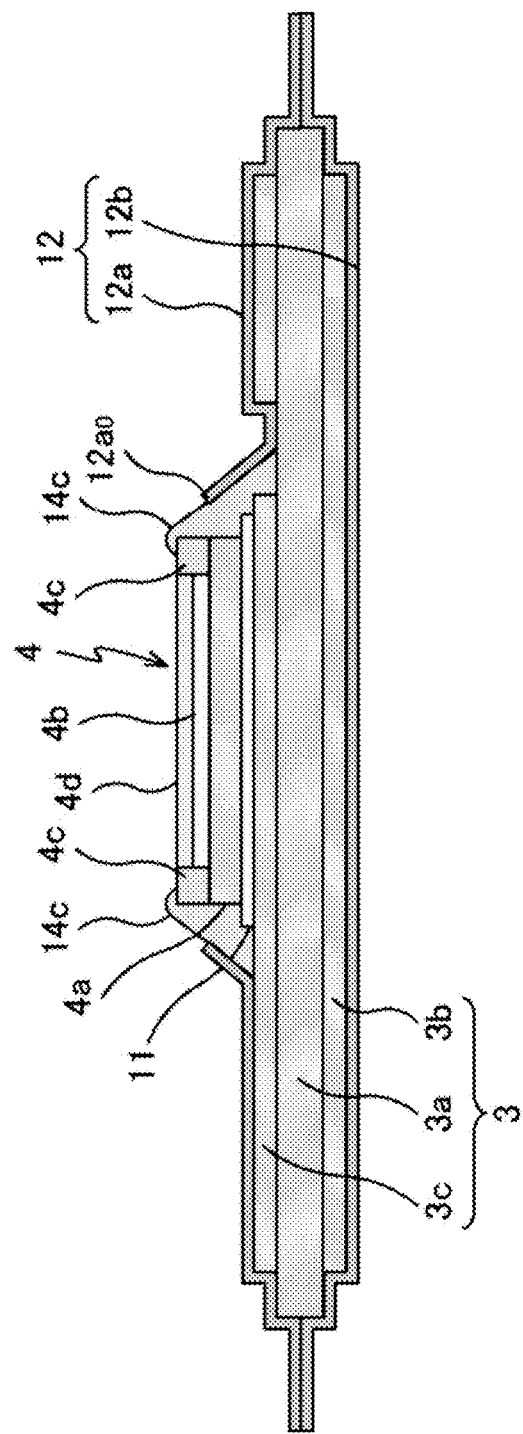
FIG. 8D shows the state where a plating film is provided on a front surface electrode of the chip after a plating step.

At Step S23 (plating step), the front surface electrode 4b of the chip 4a is plated in the same manner as the one mentioned above. Thereby, the plating film 4d is provided on the front surface electrode 4b as shown in FIG. 8D. By executing plating on a chip-by-chip basis, that is, in a state where the chip 4a (semiconductor element 4) is bonded onto the substrate 3 and is reinforced at its rear surface side, the chip 4a becomes less warped as compared with a case where plating is performed on a wafer-by-wafer basis so that the film thickness of the plating film 4d can be increased.

Figure 8E:
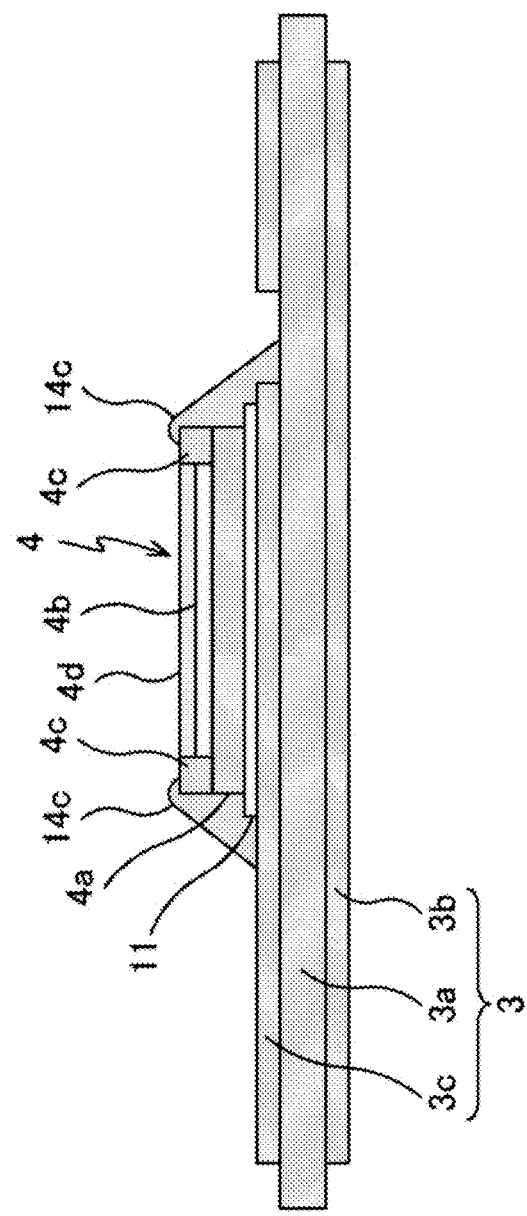
FIG. 8E shows the state where the plating protective film is removed from the substrate after a plating protection removal step.

At Step S24 (plating protective film removal step), the plating protective film 12 is removed from the substrate 3 in the same manner as the one mentioned above. Thereby, the plating protective film 12 is removed from the substrate 3 as shown in FIG. 8E.

Steps S25 and S26 are the same as those mentioned above. In this manner, the semiconductor device 110 is configured (please see FIG. 6).

Although in the semiconductor device 100 according to the present embodiment and the semiconductor device 110 according to the variant, the electrodes of the semiconductor element 4 are connected to the external terminals 7 to 9 using the conductive posts 5 and the wiring substrate 6, they may be connected instead by wire bonding. Here, wires are formed to have a diameter of 300 to 500 μm for a high withstanding voltage apparatus, for example, using for example a conductive metal such as copper or aluminum or a conductive alloy such as an iron-aluminum alloy.

Although in the semiconductor device 100 according to the present embodiment and the semiconductor device 110 according to the variant, constituent portions of the semiconductor devices 100, 110 are sealed in by molding using thermosetting resin, this is not the sole example, and the constituent portions of the semiconductor devices 100, 110 may be sealed in for example by housing the substrate 3, to which the semiconductor element 4 is bonded, in a housing, filling the inside of the housing with silicone gel and closely sealing the housing using a lid member.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a semiconductor device manufacturing method and a semiconductor device.

What is claimed is:

1. A semiconductor device manufacturing method comprising:
   bonding a rear surface of a chip having electrodes on both sides thereof to a front surface of a substrate;
   providing, to an entirety of the front surface of the substrate to which the chip is bonded, a first plating protective film having an opening at a position which is on the front surface of the chip and corresponds to an electrode at which plating is to be formed, after the bonding;
   plating the electrode of the chip after the providing while the first plating protective film covers the entirety of the front surface other than the opening; and
   removing, in a single process step without any intervening process, all of the first plating protective film from the entirety of the front surface of the substrate, after the plating, wherein
   in the providing, a second plating protective film is pasted onto a rear surface of the substrate, and a peripheral portion of a face of the first plating protective film is adhered face-to-face to a peripheral portion of a face of the second plating protective film along an edge portion of the substrate.

2. The semiconductor device manufacturing method according to claim 1, wherein
   in the providing, a first film is pasted as the first plating protective film, and
   in the removing, the first film is peeled off from the substrate.

3. The semiconductor device manufacturing method according to claim 2, wherein
   in the removing, the second plating protective film is further peeled off from the rear surface of the substrate.

4. The semiconductor device manufacturing method according to claim 2, comprising:
   forming a plurality of the chips on a wafer; and
   dicing the wafer on which the plurality of chips are formed, wherein in the bonding, a rear surface of the chip divided into pieces by dicing is bonded to the front surface of the substrate.

5. The semiconductor device manufacturing method according to claim 4, wherein
the forming a plurality of the chips includes forming a chip protective film on a periphery of the electrode at the front surface of the chip, and
in the providing, a portion surrounding the opening of the film is pasted onto the chip protective film at the periphery of the electrode.

6. The semiconductor device manufacturing method according to claim 4, wherein
the forming a plurality of the chips includes forming a chip protective film on a periphery of the electrode at the front surface of the chip,
the method further comprises forming a chip surrounding-portion protective film to cover a peripheral portion of the chip in the substrate after the bonding, and
in the providing, a portion surrounding the opening of the film is pasted onto the chip surrounding-portion protective film.

7. The semiconductor device manufacturing method according to claim 6, wherein in the bonding, the rear surface of the chip is solder-bonded to the front surface of the substrate without using a flux material.

8. The semiconductor device manufacturing method according to claim 5, wherein the chip protective film is, at the periphery of the electrode, thicker than the electrode after plating.

9. The semiconductor device manufacturing method according to claim 5, wherein the chip protective film contains polyimide as a principal component thereof.

10. The semiconductor device, manufacturing method according to claim 1, further comprising:
curing an adhesive layer on the first plating protective film and an adhesive layer on the second plating protective film by irradiation of UV light.

* * * * *